United States Patent [19]

Mitsui et al.

[11] Patent Number: 5,296,401
[45] Date of Patent: Mar. 22, 1994

[54] MIS DEVICE HAVING P CHANNEL MOS DEVICE AND N CHANNEL MOS DEVICE WITH LDD STRUCTURE AND MANUFACTURING METHOD THEREOF

[75] Inventors: Katsuyoshi Mitsui; Shigeki Komori, both of Hyogo, Japan

[73] Assignee: Mitsubishi Denki Kabushiki Kaisha, Tokyo, Japan

[21] Appl. No.: 973,250

[22] Filed: Nov. 9, 1992

Related U.S. Application Data

[60] Division of Ser. No. 869,084, Apr. 15, 1992, abandoned, which is a continuation of Ser. No. 635,316, Jan. 3, 1991, abandoned.

[30] Foreign Application Priority Data

Jan. 11, 1990 [JP] Japan .................... 2-4743

[51] Int. Cl.$^5$ ............................................. H01L 21/70
[52] U.S. Cl. ........................ 437/57; 437/42; 437/44; 437/56
[58] Field of Search ............... 357/23.3, 42; 437/42, 437/44, 43, 57, 56, 42, 44, 43

[56] References Cited

U.S. PATENT DOCUMENTS

| | | | |
|---|---|---|---|
| 4,613,882 | 9/1986 | Pimbley et al. | 357/23.3 |
| 4,703,551 | 11/1987 | Szluk et al. | 437/44 |
| 4,874,713 | 10/1989 | Gioia | 437/44 |
| 4,876,213 | 10/1989 | Pfiester | 357/23.3 |
| 4,891,326 | 1/1990 | Koyanagi | 437/57 |
| 4,906,588 | 3/1990 | Harrington, III | 437/57 |
| 4,908,327 | 3/1990 | Chapman | 357/23.3 |
| 4,937,645 | 6/1990 | Ootsuka et al. | 357/23.3 |
| 4,939,100 | 7/1990 | Jeuch et al. | 357/23.3 |
| 4,954,867 | 9/1990 | Hosaka | 357/23.3 |
| 4,956,311 | 9/1990 | Liou et al. | 437/57 |
| 4,968,639 | 11/1990 | Bergonzoni | 437/57 |
| 5,021,354 | 6/1991 | Pfiester | 437/34 |
| 5,024,960 | 6/1991 | Haken | 437/57 |
| 5,030,582 | 7/1991 | Miyajima et al. | 437/57 |

FOREIGN PATENT DOCUMENTS

| | | | |
|---|---|---|---|
| 0169600 | 1/1986 | European Pat. Off. | 437/44 |
| 3818533 | 12/1988 | Fed. Rep. of Germany | 357/23.3 |
| 63-258069 | 10/1988 | Japan | 357/23.3 |
| 1-55855 | 3/1989 | Japan | 357/23.3 |
| 1-99259 | 4/1989 | Japan | 357/23.3 |
| 1-283956 | 11/1989 | Japan | 357/23.3 |

OTHER PUBLICATIONS

IEEE Transactions on Electron Devices, vol. ED33, No. 3, Mar. 1986, "A New Half-Micrometer p-Channel MOSFET with Efficient Punch through Stops", by Odanaka et al., pp. 317-321.

Tsang et al., "Fabrication of High-Performance LDDFET's with Oxide Sidewall-Spacer Technology", IEEE Transactions on Electron Devices, vol. ED-29, No. 4, Apr. 1982.

*Primary Examiner*—Brian E. Hearn
*Assistant Examiner*—Kevin M. Picardat
*Attorney, Agent, or Firm*—Lowe, Price, LeBlanc & Becker

[57] ABSTRACT

In a CMOS semiconductor device, a pMOS transistor and an nMOS transistor are formed on a single substrate. Each of the source/drain regions of the nMOS transistor and the pMOS transistor has LDD structure composed of a combination of a low concentration impurity region and a high concentration impurity region. The low concentration impurity region of the LDD structure of the pMOS transistor is formed in a self-align manner by ion implantation using a sidewall spacer with relatively thick film thickness. The low concentration impurity region of the LDD structure of the nMOS transistor is formed in a self-align manner by ion implantation using a relatively thin sidewall spacer as a mask. The sidewall spacer with thick film thickness of the pMOS transistor restrains that the channel between the source/drain regions is shortened due to thermal diffusion to cause punch through. As for the sidewall spacer of the nMOS transistor, its film thickness is selected to effectively restrain hot carrier effect in the vicinity of the drain and restrain degradation of current handling capability due to parasitic resistance to the minimum.

5 Claims, 20 Drawing Sheets

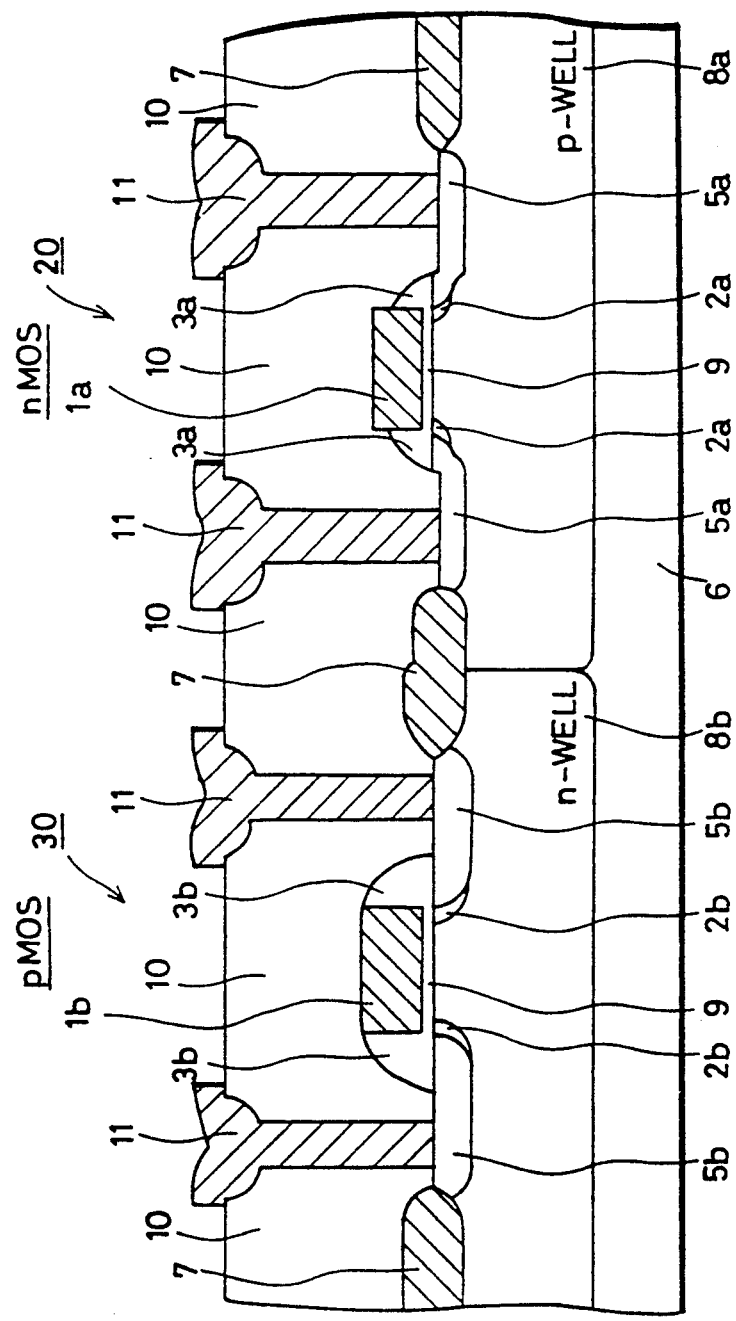

MIS DEVICE HAVING P CHANNEL MOS DEVICE AND N CHANNEL MOS DEVICE WITH LDD STRUCTURE AND MANUFACTURING METHOD THEREOF

This application is a divisional of application Ser. No. 07/869,084, filed Apr. 15, 1992, abandoned, which is a continuation of application Ser. No. 07/635,316 filed Jan. 3, 1991, now abandoned.

BACKGROUND OF THE INVENTION

1. Field of the Invention

The present invention relates to a MIS device, and particularly to an improvement of so-called LDD (Lightly Doped Drain) structure of a PMOS transistor and a NMOS transistor formed on the same substrate and a method of manufacturing the improved LDD structure.

2. Description of the Background Art

A device provided with multi-layered structure of metal-insulator-semiconductor is generally referred to as an MIS device. An MOS device is a kind of MIS device, in which an oxide film is used for an insulator of the MIS device.

Semiconductor devices in which a p-channel MOS field effect transistor (referred to as a pMOS transistor hereinafter) and a n-channel MOS field effect transistor (referred to as a NMOS transistor hereinafter) are formed on a single semiconductor substrate include a CMOS semiconductor device, for example. FIG. 6 is a sectional structure view of a conventional CMOS semiconductor device. A p well region 8a and a n well region 8b in contact with each other are formed on a surface of a silicon substrate 6. Thick field oxide films 7 are formed at given positions on the main surface of the silicon substrate 6. The p well region 8a surface surrounded by the field oxide film 7 forms a n MOS transistor forming region, and the n well region 8b surface surrounded by the field oxide film 7 forms a pMOS transistor forming region.

The nMOS transistor 20 has a gate electrode 1a on the surface of the p well region 8a with a thin gate insulating film 9 disposed therebetween. Sidewall spacers 3a and 3a composed of insulating films are formed on sidewalls of the gate electrode 1a. Also, a pair of source/drain regions including n⁻ impurity regions 2a, 2a of relatively low concentration and n+ impurity regions 5a, 5a of relatively high concentration are formed in the p well region 8a surface. Such structure of source/drain regions is referred to as LDD structure. Source/drain interconnection layers 11, 11 are respectively connected to the surfaces of the n+ impurity regions 5a, 5a of the source/drain region.

Also, the pMOS transistor 30 includes a gate electrode 1b on the surface of the n well region 8b with a thin gate insulating film 9 disposed therebetween. Sidewall spacers 3b, 3b formed of insulating films are formed on the sidewalls of the gate electrode 1b. Furthermore, source/drain region composed of p⁻ impurity regions 2b, 2b of relatively low concentration and p+ impurity regions 5b, 5b of relatively high concentration are formed at the surface of the n well region 8b. This source/drain region forms the so-called LDD structure. Moreover, source/drain interconnection layers 11, 11 are respectively connected to the p+ impurity regions 5b, 5b of the source/drain region. The silicon substrate 6 surface in which a transistor is formed is covered with a thick interlayer insulating layer 10.

Next, a method of manufacturing the above-described CMOS semiconductor device will be described referring to FIGS. 7A-7H.

First, referring to FIG. 7A, a p well region 8a and an n well region 8b are formed on a silicon substrate 6 surface, and thick field oxide films 7 are formed at given regions on the silicon substrate 6 surface. Furthermore, gate insulating films 9 are formed on the surfaces of the p well region 8a and the n well region 8b. A polysilicon layer 12 is deposited on the surface of the gate insulating film 9.

Next, referring to FIG. 7B, the polysilicon layer 12 is patterned into a rectangular form using the photolithography method and the anisotropic etching method to form the gate electrode 1a of the nMOS transistor and the gate electrode 1b of the pMOS transistor.

Moreover, referring to FIG. 7C, after covering the surface of the p well region 8a with a resist pattern 4a, p type impurity ions 15 such as boron (B) are implanted into the n well region 8b using the gate electrode 1b as a mask. By this ion implantation, p⁻ impurity regions 2b, 2b of low concentration are formed on the n well region 8b surface.

Furthermore, as shown in FIG. 7D, after removing the resist pattern 4a on the p well region 8a surface, a resist pattern 4b is now formed covering the surface of the n well region 8b. Subsequently, n type impurity ions 16 such as phosphorus (P) or arsenic (As) are directed on the p well region 8a surface using the gate electrode 1a as a mask to form n⁻ impurity regions 2a, 2a of low concentration.

Furthermore, as shown in FIG. 7E, after removing the resist pattern 4b, an oxide film 13 is deposited all over the surface of the silicon substrate 6 using the low pressure CVD (Chemical Vapor Deposition) method.

Subsequently, referring to FIG. 7F, the oxide film 13 is anisotropically etched to form sidewall spacers 3a, 3b having the same film thickness on the sidewalls of the gate electrodes 1a and 1b.

Next, referring to FIG. 7G, after forming a resist pattern 4c covering the surface of the n well region 8b again, n type impurity ions 17 such as arsenic are implanted using the gate electrode 1a and the sidewall spacers 3a as masks. Subsequently, after removing the resist pattern 4c, thermal treatment is applied for activating the implanted ions. Thus, n+ impurity regions 5a, 5a of high concentration are formed in the p well region 8a surface. The LDD structure of the source/drain region of a nMOS transistor is then completed.

Furthermore, referring to FIG. 7H, a new resist pattern 4d is formed covering the surface of the p well region 8a. P type impurity ions 18 are directed on the n well region 8b surface using the gate electrode 1b and the sidewall spacers 3b as masks. Next, after removing the resist pattern 4d, applying thermal treatment, the ions implanted into the n well region 8b are activated. In this way, the p+ impurity regions 5b, 5b are formed. Thus, the LDD structure of source/drain region of a pMOS transistor is completed in the above steps.

Subsequently, an interlayer insulating film 10 is formed on the surface of the silicon substrate 6, and a contact hole is formed at a given position. An interconnection layer 11 is then formed at a given position through the contact hole to finish the process of manufacturing a CMOS semiconductor device (not shown).

The progress of fine processing technique of element structure is pointed out as technical background of a CMOS semiconductor device with such LDD structure as described above. The tendency of element structure miniaturization is seen in the aspects such as shortening of the gate length according to the scale down rule and forming of shallow junction region in a MOS transistor. The "scale down rule" is described in *VLSI Electronics Microstructure Science*, Volume 18, "Advanced MOS Device Physics", Academic Press. Inc. 1989. Also, it means shortening of the gate length of a MOS transistor, that is, shortening of a channel, which causes various problems so-called short channel effect. That is to say, for example, hot carriers are generated due to the high electric field produced in the vicinity of a drain in a short channel MOS transistor, and a portion of the hot carriers are captured in a trap in the gate insulating film to form a new level. As a result, characteristic degradation such as shift of a threshold value voltage of a MOS transistor and a decrease of mutual transconductance are caused. The high electric field produced in the vicinity of a drain also caused degradation of the drain breakdown voltage due to the avalanche breakdown. The LDD structure of a MOS transistor is a device proposed to solve such problems. Especially, it restrains generation of the high electric field by forming an impurity region with moderately changing concentration distribution in the vicinity of the drain to obtain high avalanche breakdown voltage and a decrease of reliability degradation due to hot carriers.

In a miniaturization method of CMOS semiconductor devices, it is needed to reduce the gate length $L_{Gp}$ of pMOS transistor 30 and the gate length $L_{Gn}$ of nMOS transistor 20 and make the lengths equal. As the gate lengths $L_{Gp}$, $L_{Gn}$ of pMOS transistor 30 and nMOS transistor 20 get longer, the gate capacitance increases to increase the RC constant, with the result that operation of transistors are delayed. Accordingly, the channel lengths Ln and Lp defined in a self aligning manner utilizing gate electrodes 1b and 1a are also preferably reduced to have the equal lengths.

However, turning to FIG. 6 again, the pMOS transistor 30 and the nMOS transistor 20 are provided with low concentration impurity regions 2a, 2b of the LDD structure having different shapes in a CMOS semiconductor device manufactured through the manufacturing steps described-above. That is to say, in the pMOS transistor 30, the diffusion length of the low concentration p− impurity region 2b is extremely small as compared to that of the nMOS transistor 20. Also, the channel length $L_p$ between the high concentration p+ impurity regions 5b, 5b are shorter than the channel length $L_n$ of the nMOS transistor 20. This is because, boron (B), impurity forming the source/drain region of the pMOS transistor 30, has a larger diffusion coefficient as compared to that of phosphorus and arsenic forming the source/drain region of the nMOS transistor 20. This is understood by comparing the steps shown in the above FIGS. 7G and 7H. In other words, in the nMOS transistor 20, the high concentration n+ impurity regions 5a, 5a formed in a self-align manner with respect to the sidewall spacers 3a slightly diffuse under the sidewall spacers 3a by the thermal treatment for activation. On the other hand, in the pMOS transistor, the high concentration p+ impurity regions 5b, 5b formed in a self-align manner with respect to the sidewall spacers 3b widely diffuse under the sidewall spacers 3b in the thermal treatment for activating. In this way, the diffused high concentration p+ impurity regions 5b, 5b cover the low concentration p− impurity regions 2b, 2b regions, so that the diffusion length of the low concentration p− impurity region 2b is decreased. Thus, punch through phenomena easily occurs between the pair of high concentration p+ impurity regions 5b, 5b narrowed due to diffusion of impurity of large diffusion coefficient. This punch through phenomena is further facilitated as the gate length becomes shorter while the device is refined.

As described above, the LDD structure of the pMOS transistor and the nMOS transistor composed of impurities of different diffusion coefficients are manufactured employing the sidewall spacers 3a, 3b having the same film thickness. Accordingly, if the film thickness of the sidewall spacers 3a, 3b is selected to be suitable for the LDD structure of the nMOS transistor, for example, resistance to the punch through between the high concentration p+ impurity regions 5b, 5b is easily degraded in a pMOS transistor. On the other hand, if the sidewall spacers are formed with film thickness suitable for the LDD structure of the pMOS transistor, the drain current between the source and the drain is degraded in the nMOS transistor 20. This is because, as the film thickness of the sidewall spacers 3a is increased, the diffusion length of the low concentration n− impurity regions 2a, 2a is increased, and the low concentration n− impurity diffusion layers 2a act as parasitic resistance between the source and the drain to degrade the drain current. In this way, in a conventional CMOS semiconductor device, the sidewall spacers 3a, 3b defining the low concentration impurity regions of the LDD structure are formed with the same film thickness in the pMOS transistor and the nMOS transistor, so that a LDD structure which can satisfy requirements of both of the pMOS transistor 30 and the nMOS transistor 20 could not be obtained. Conventionally, by the sacrifice of source-drain current degradation of the nMOS transistor 20 to some extent to prevent the punch through phenomena of the pMOS transistor 30, the film thickness of the sidewall spacers 3a, 3b has been determined focusing on the operational reliability.

SUMMARY OF THE INVENTION

It is an object of the present invention to implement LDD structure having low concentration impurity regions with suitable diffusion length for each of a pMOS transistor and a nMOS transistor formed on the same semiconductor substrate.

It is another object of the present invention to implement sidewall spacers having different film thicknesses at sidewalls of the respective gate electrodes of the pMOS transistor and the nMOS transistor formed on the same semiconductor substrate.

It is still another object of the present invention to simultaneously implement high resistance to punch through of the pMOS transistor, and high resistance to hot carriers and high drain breakdown voltage of the nMOS transistor formed on the same semiconductor substrate.

It is yet another object of the present invention to provide a manufacturing method for forming LDD structure employing sidewall spacers having film thicknesses different from each other.

The present invention comprises a semiconductor device having a n-channel MOS type field effect transistor and a p-channel MOS type field effect transistor formed on a main surface of the same semiconductor substrate, and the n-channel MOS type field effect transistor includes a gate electrode formed on the main surface of the semiconductor substrate with an insulating film provided therebetween, sidewall spacers formed on sidewalls of the gate electrode, and a pair of n type impurity regions, each of which is composed of a relatively low concentration region formed in a self-align manner with respect to the gate electrode formed in the main surface of the semiconductor substrate and a relatively high concentration region formed in a self-align manner with respect to the sidewall spacers. Also, the p-channel MOS type field effect transistor includes a gate electrode formed on the main surface of the semiconductor substrate with an insulating film provided therebetween, sidewall spacers formed on sidewalls of the gate electrode, and a pair of p type impurity regions, each of which is composed of a relatively low concentration region formed in a self-align manner with respect to the gate electrode formed in the main surface of the semiconductor substrate and a relatively high concentration region formed in a self-align manner with respect to the sidewall spacers. It is also characterized in that the sidewall spacers of the n-channel MOS type field effect transistor and the sidewall spacers of the p-channel MOS type field effect transistor have different film thicknesses with each other on the sidewalls of the respective gate electrodes.

A method of manufacturing a semiconductor device having a p-channel MOS type field effect transistor and a n-channel MOS type field effect transistor formed on the same semiconductor substrate includes the steps below.

A p type transistor forming region and a n type transistor forming region are formed on a main surface of a semiconductor substrate. Insulating layers are formed on the surfaces of the p type transistor forming region and the n type transistor forming region, a polysilicon layer is formed all over the surface of this insulating layer, and then the polysilicon layer is patterned into a predetermined shape. After covering the surface of the p type transistor forming region, p type impurity is implanted into the n type transistor forming region using the patterned polysilicon layer as a mask to form relatively low concentration p type impurity regions. After covering the surface of the n type transistor forming region with a resist, n type impurity is implanted into the p type transistor forming region using the patterned polysilicon layer as a mask to form relatively low concentration n type impurity regions. By forming an insulating layer all over the semiconductor substrate provided with the patterned polysilicon layer and etching the same, sidewall spacers of insulating layers are formed on sidewalls of the polysilicon layers positioned on the n type and the p type transistor forming regions. After covering the surface of the n type transistor forming region with a resist, the sidewall spacers formed on the sidewalls of the polysilicon layer in the p type transistor forming region is etched to decrease the film thickness of the sidewall spacers on the polysilicon layer sidewalls. After covering the surface of the n type transistor forming region with a resist, n type impurity is implanted into the p type transistor forming region using the polysilicon layer on the exposed p type transistor forming region and the sidewall spacers formed on sidewalls thereof as masks to form relatively high concentration n type impurity regions. Covering the surface of the p type transistor forming region with a resist, p type impurity is implanted into the n type transistor forming region using the polysilicon layer on the exposed n type transistor forming region and the sidewall spacers formed on the sidewalls thereof as masks to form relatively high concentration p type impurity regions.

In the semiconductor device according to the present invention, sidewall spacers are formed by the same etching process on sidewalls of gate electrodes of a p-channel MOS type field effect transistor and a n-channel MOS type field effect transistor, one of the MOS type field effect transistor forming regions is covered, and then the sidewall spacers of the other exposed MOS type field effect transistor are etched to reduce its film thickness. The LDD structure of the p-channel MOS type field effect transistor and the n-channel MOS type field effect transistor is formed in a self-align manner using the sidewall spacers having different film thicknesses with each other. Accordingly, the diffusion length of the low concentration impurity regions of the LDD structure can be controlled to be a suitable value in accordance with the conditions required for the respective transistors. In a preferable embodiment, the sidewall spacers of the p-channel MOS type field effect transistor are formed having their film thickness larger than that of the sidewall spacers of the n-channel MOS type field effect transistor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a sectional structural views of the CMOS semiconductor device according to the second embodiment of the present invention.

DESCRIPTION OF THE PREFERRED EMBODIMENTS

Embodiments of the present invention will be described in detail referring to the figures.

Figure 1:
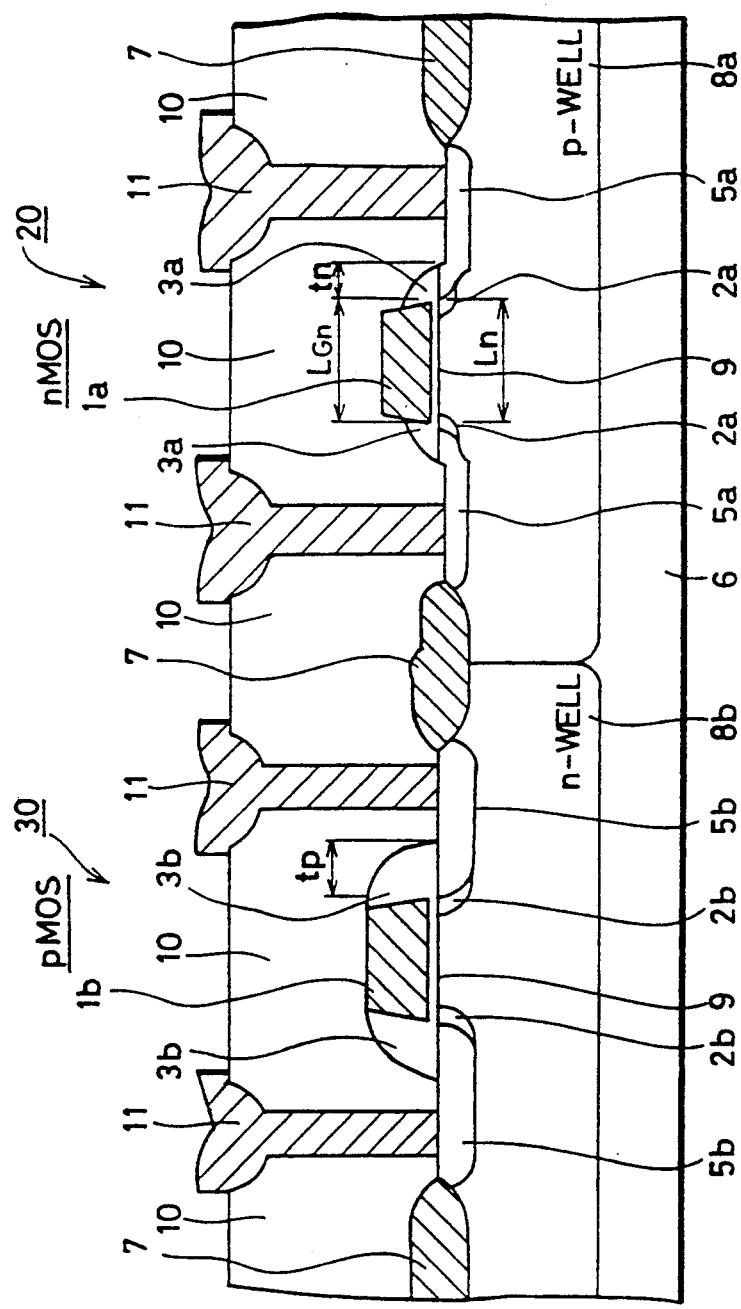
FIG. 1 is a sectional structural diagram of a CMOS semiconductor device according to the first embodiment of the present invention.

Referring to FIG. 1, a p well region 8a and an n well region 8b are formed adjacent to each other on a main surface of a silicon substrate 6. Thick field oxide films 7 are formed in the predetermined regions on the main surface of the silicon substrate 6. A NMOS transistor 20 is formed on the surface of the p well region 8a and a p MOS transistor 30 is formed on the surface of the n well region 8b.

The nMOS transistor 20 is provided with a gate electrode 1a formed on the surface of the p well region 8a with a gate insulating film 9 provided therebetween. The sectional shape of the gate electrode 1a is formed to be a trapezoid. Sidewall spacers 3a, 3a composed of insulating layers are formed on the sidewalls of the trapezoidal gate electrode 1a. A pair of source/drain regions, each composed of a relatively high concentration n+ impurity region 5a and a relatively low concentration n− impurity region 2a, are formed in the p well region 8a main surface. The source/drain regions form so-called LDD structure. The n− impurity regions 2a of low concentration are formed in a self-align manner using the gate electrode 1a as a mask, and the n+ impurity regions 5a of high concentration are formed in a self-align manner using the sidewall spacers 3a as masks. Accordingly, the diffusion length of the low concentration n− impurity region 2a is defined by the film thickness $t_n$ of the sidewall spacer 3a and the thermal treatment condition for activation. The gate length $L_{Gn}$ and the channel length $L_n$ are formed nearly equal.

The pMOS transistor 30 is provided with a gate electrode 1b formed on the surface of the n well region 8b with a gate insulating film 9 provided therebetween. The gate electrode 1b has a trapezoidal sectional shape. Sidewall spacers 3b, 3b composed of insulating layers are formed on sidewalls of the gate electrode 1b. A pair of source/drain regions composed of relatively high concentration p+ impurity regions 5b and relatively low concentration p− impurity regions 2b are formed in the main surface of the n well region 8b. The source/drain regions form so-called LDD structure. The p− impurity region 2b of low concentration is formed in a self-align manner using the gate electrode 1b as a mask. The p+ impurity region 5b of high concentration is formed in a self-align manner using the sidewall spacer 3b as a mask. Accordingly, the diffusion length of the p− impurity region 2b of low concentration is defined by the film thickness $t_p$ of the sidewall spacer 3b and the thermal process condition for activation.

Boron (B) which is p type impurity forming the source/drain region of the pMOS transistor 30 has a larger diffusion rate for heating as compared with the n type impurity forming the source/drain region of the nMOS transistor 20, e.g., arsenic (As) and Phosphorus (P). Therefore, the film thickness $t_p$ of the sidewall spacer 3b of the pMOS transistor 30 is set to be larger than the film thickness $t_n$ of the sidewall spacer of the nMOS transistor 20. Consequently, it can be prevented that the thermal diffusion of the high concentration p+ impurity region 5b of the pMOS transistor 30 in the following thermal treatment for activating the impurity region narrows the diffusion length of the low concentration p− impurity region 2b, and that the punch through phenomena occurs because the distance between the high concentration p+ impurity regions 5b, 5b is narrowed more than required. Also, the value of the film thickness $t_n$ of the sidewall spacer 3a of the nMOS transistor 20 is determined in the trade-off of restraint of the hot carrier effect and a decrease of current driving ability of the transistor due to an increase of parasitic resistance of the low concentration n− impurity region 2a. The film thickness $t_p$ of the sidewall spacer of the pMOS transistor 30 is preferably 0.25 μm–0.3 μm, and the film thickness $t_n$ of the sidewall spacer of the nMOS transistor 20 is preferably 0.1 μm–0.15 μm.

Next, the process of manufacturing the CMOS semiconductor device shown in FIG. 1 will be described referring to FIGS. 2A–2I.

Figure 2A:
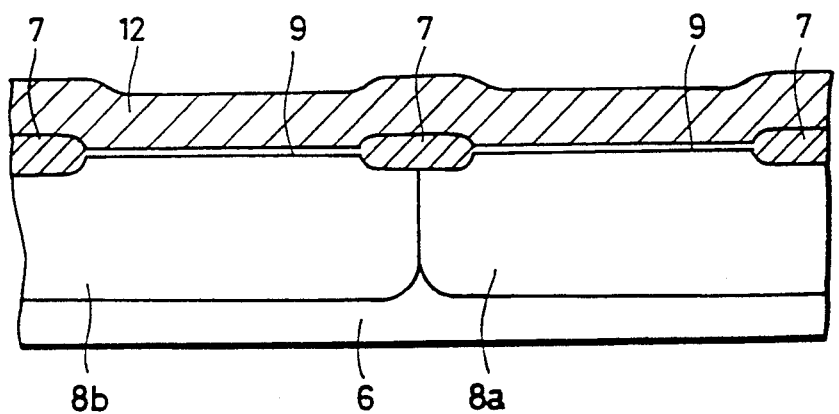
FIGS. 2A, 2B, 2C, 2D, 2E, 2F, 2G, 2H, 2I and 2J are manufacturing process sectional views of the CMOS semiconductor device shown in FIG. 1.

First, referring to FIG. 2A, a p well region 8a and a n well region 8b are formed adjacent to each other on a main surface of a silicon substrate 6. Furthermore, a field oxide film 7 with thick film thickness is formed by the LOCOS method or the like in a predetermined region on the main surface of the silicon substrate 6. Next, a thin gate insulating films 9 are formed on the surfaces of the p well region 8a and the n well region 8b using the thermal oxidation method or the like. A polysilicon layer 12 is formed all over the surface of the silicon substrate 6 using the CVD method.

Figure 2B:
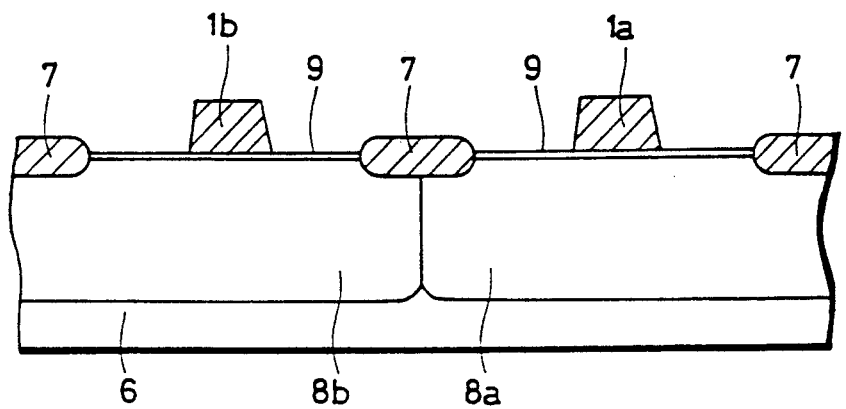

Referring to FIG. 2B, the polysilicon layer 12 is patterned into a predetermined shape using the photolithography method and the etching method to form a gate electrode 1a of the NMOS transistor and a gate electrode 1b of the pMOS transistor. The gate electrodes 1a, 1b are formed having trapezoidal sectional shapes with tapered oblique sides spreading downward. For this etching, the following two methods are used. In the first method, after implanting Ar+ into polysilicon layer 12 to a high concentration ($10^{16}/cm^2$), the polysilicon layer 12 is etched using the reactive ion etching method. In another method, first, a non-doped oxide film is deposited on the surface of polysilicon layer 12 using the CVD method. A resist pattern with a desired shape is formed on the surface of the oxide film. Using the resist pattern as a mask, the oxide film is isotropically etched using hydrofluoric acid. By this etching, the oxide film under the resist pattern is undercut. Subsequently, using the reactive ion etching method, the polysilicon layer 12 is subjected to patterning.

A silicon nitride film may be used instead of the oxide film, and thermal phosphoric acid may be used instead of the hydrofluoric acid.

Figure 2C:
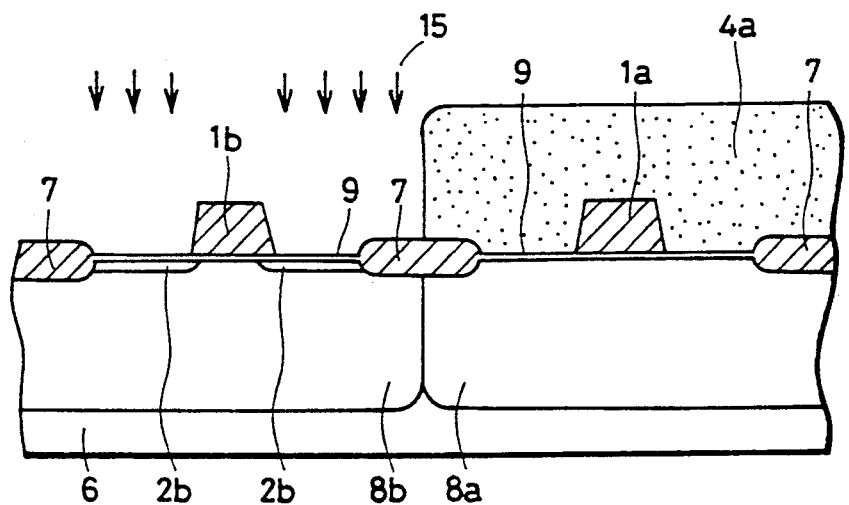

Referring to FIG. 2C, the surface of the p well region 8a is covered with a resist pattern 4a. Subsequently, p type impurity ions 15 such as boron are implanted in the n well region 8b surface in the dose of about $1 \times 10^{13}/cm^2$ using the gate electrode 1b as a mask. The p− impurity regions 2b, 2b of low concentration are formed in this step.

Figure 2D:
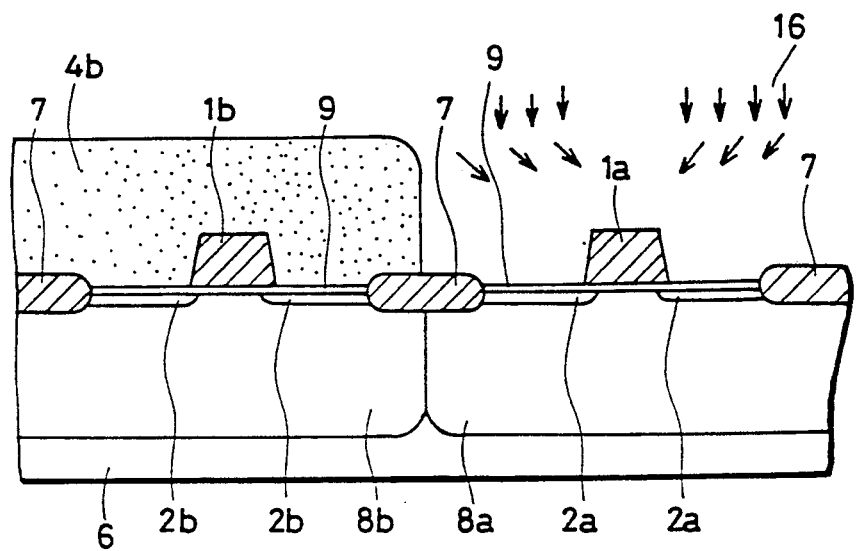

Referring to FIG. 2D, after removing the resist pattern 4a, the surface of the n well region 8b is now covered with a resist pattern 4b. Subsequently, ion-implantation of n type impurity ions 16 such as phosphorus or arsenic in the dose of about $1 \times 10^{13}/cm^2$ is performed using the gate electrode 1a as a mask. N− impurity regions 2a, 2a are formed on the p well region 8a surface by this ion implantation. Incidentally, this ion implantation may be performed in the oblique direction to the main surface of the silicon substrate 6 employing n type impurity ions 16. In case where the oblique ion implantation is employed, a portion of the low concentration n− impurity region 2a can be extended right under the gate electrode 1a. In the ion implantation process of boron shown in FIG. 2C, the oblique rotation ion implantation method is not used. This is because, since boron has a larger thermal diffusion coefficient as compared to phosphorus and arsenic, a portion thereof extends under gate electrode 1b by the thermal treatment in the following process without employing the oblique ion implantation.

Figure 2E:
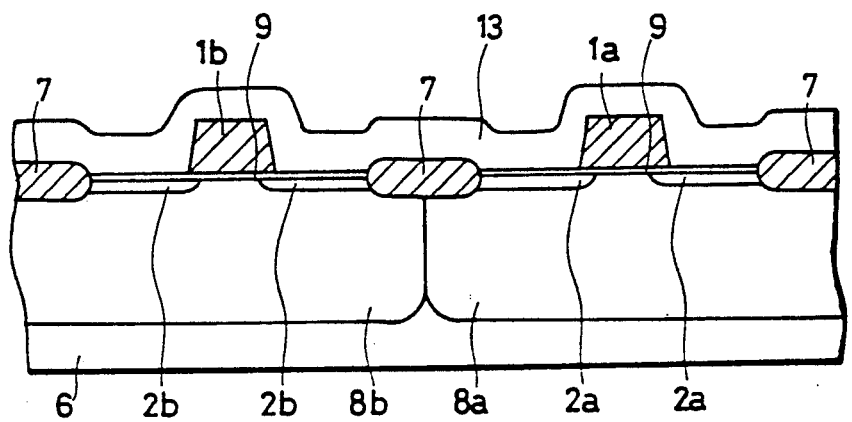

Referring to FIG. 2E, a silicon oxide film 13 is deposited all over the surface of the silicon substrate 6 using the low pressure CVD method. The low pressure CVD method is described in detail in "Low Pressure CVD Production Processes for Poly, Nitride and Oxide", Richard S. Rosler, Solid State Technology, April, 1977. The film thickness of the silicon oxide film 13 is approximately 0.25 μm, which is selected to be equal to the film thickness of the sidewall spacer 3b of the pMOS transistor formed in a later step.

Figure 2F:
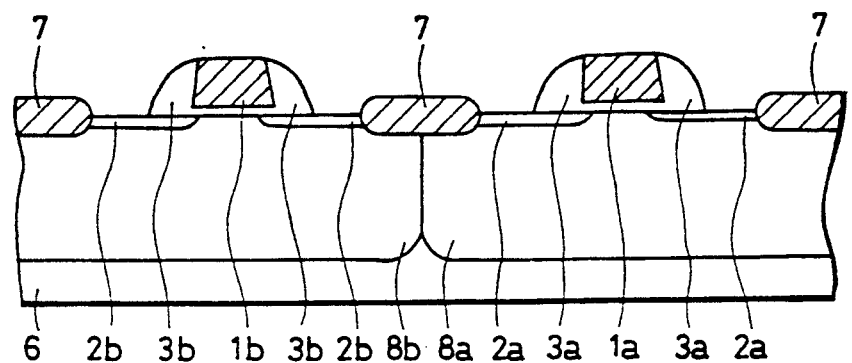

Referring to FIG. 2F, the silicon oxide film 13 is anisotropically etched and removed using the reactive ion etching. Sidewall spacers 3a, 3b composed of silicon oxide films are formed on sidewalls of the gate electrodes 1a, 1b by this etching. In this stage, the film thicknesses of the sidewall spacers 3a, 3b of the nMOS transistor 20 and the pMOS transistor 30 are equal.

Figure 2G:
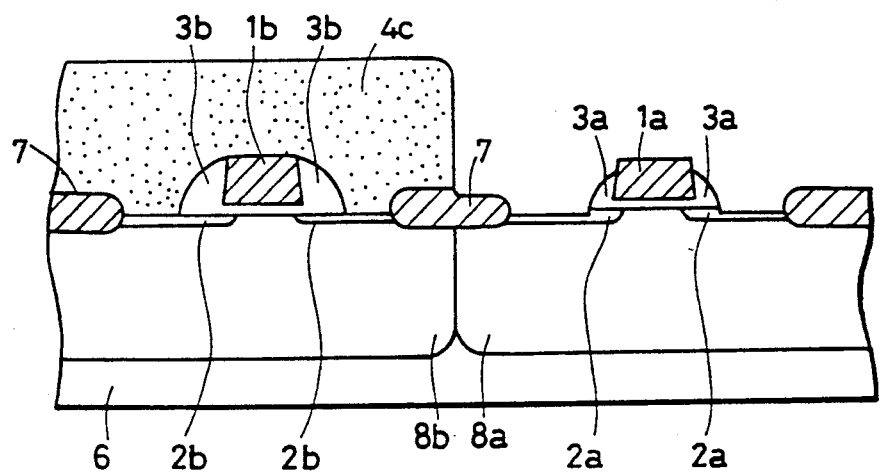

Referring to FIG. 2G, after covering the surface of the n well region 8b with a resist pattern 4c, the sidewall spacer 3a of the nMOS transistor is partially etched and removed using anisotropic etching such as plasma etching. The surface of sidewall spacer 3a is gradient according to the taper-like side surface of gate electrode 1a. Accordingly, even upon application of anisotropic etching, the sidewall spacer 3a is also removed in the direction of the film thickness. Then, the film thickness of the sidewall spacer 3a is set to be a predetermined thickness. In this etching step, the field oxide film 7 surface and the p well region 8a surface are slightly over etched.

Figure 2H:
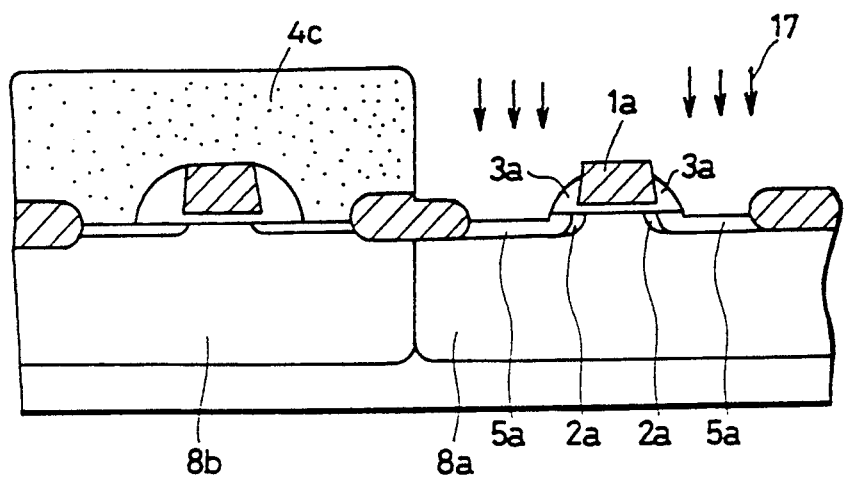

Referring to FIG. 2H, arsenic ions 17 in the dose of about $1 \times 10^{15}/cm^2$ are implanted using the gate electrode 1a and the sidewall spacers 3a, 3a as masks. In this way, high concentration n+ impurity regions 5a, 5a are formed. Subsequently, after removing the resist patter 4c, thermal treatment for activating the implanted ion is performed.

Figure 2I:
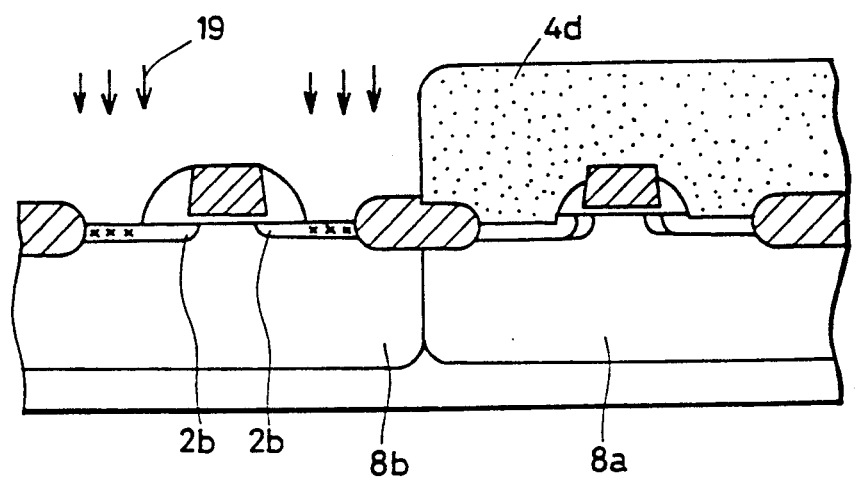

Referring to FIG. 2I, the surface of the p well region 8a is covered with a resist pattern 4d. Ions 19 such as silicon or germanium are directed onto the surface of the n well region 8b to render the surface of the n well region 8b amorphous. The process is applied in order to prevent a channelling phenomenon from occurring in the next process. The channelling phenomenon means a phenomenon in which impurity ions implanted into a substrate penetrate too deep passing through interstices of arrangement of primitive lattice. The channelling phenomenon is more likely to occur when light atoms such as boron are employed rather than phosphorus and arsenic. Accordingly, the crystal lattice of the substrate is put into disorder by making the substrate surface amorphous to prevent the channelling phenomenon.

Figure 2J:
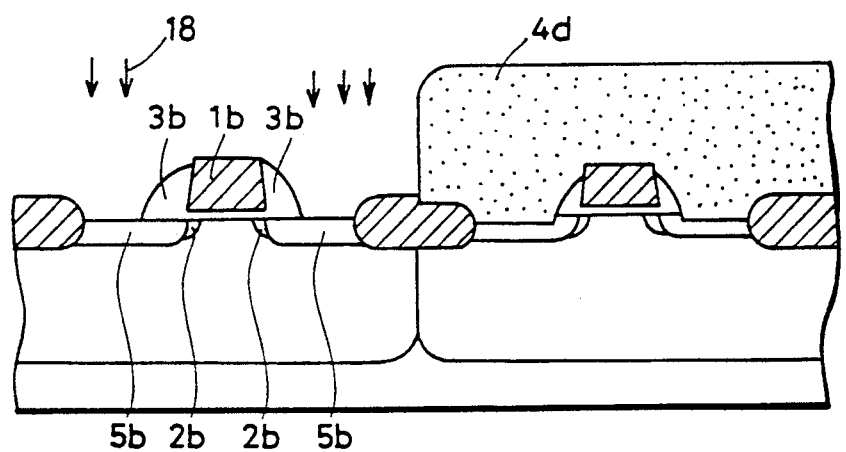

Referring to FIG. 2J, p type impurity ions 18 such as boron (B), (BF$_2$) in the dose of approximately $1 \times 15^{15}/cm^2$ are implanted using the gate electrode 1b and the sidewall spacers 3b, 3b as masks. Thus, high concentration p+ impurity regions 5b, 5b are formed. Furthermore, after removing the resist pattern 4d, thermal treatment for activating the implanted impurity ions is performed at the temperature of about 900° C. for about 30 minutes. The high concentration p+ impurity regions 5b, 5b are diffused in direction toward the region right under the gate electrode 1b or in the depth direction of the silicon substrate 6 by this thermal treatment. In ion implantation of p type impurity ions 18, as the n well region 8b surface has been rendered amorphous in a former step, channelling of the p type impurity ions 18 is prevented. Accordingly, a shallow p+ impurity region 5b of high concentration is formed. As an example, when boron ions are implanted into the silicon substrate to a dose of $1 \times 10^{14}/cm^2$ with implantation energy of 20 keV, the diffusion depth of the impurity region is about 0.57 μm. When silicon ions are implanted to a dose of $2 \times 10^{15}/cm^2$ with implantation energy of 80 keV to make the substrate surface amorphous, however, the diffusion depth of an impurity region formed by implanting boron ions under conditions same as those described above is about 0.22 μm.

Subsequently, depositing an interlayer insulating layer 10 all over the surface, and forming a contact hole, an interconnection layer 11 is formed to complete a CMOS semiconductor device shown in FIG. 1.

Next, a sectional structure of a CMOS semiconductor device according to the second embodiment of the present invention is shown in FIG. 3. As compared to the first embodiment, in the second embodiment, the sectional shapes of the gate electrodes 1a, 1b are formed as rectangular sections. In common with the first embodiment, as for the sidewall spacers 3a, 3b formed on sidewalls of the gate electrodes 1a, 1b, the film thickness of the spacer 3b of the pMOS transistor is larger, and the film thickness of the sidewall spacer 3a of the nMOS transistor is smaller. The diffusion length of the low concentration impurity regions 2a, 2b of the LDD structure defined by the film thicknesses of these sidewall spacers 3a, 3b and the thermal treatment is controlled suitably just like the first embodiment.

Now, a process of manufacturing the CMOS semiconductor device shown in FIG. 3 will be described below referring to FIGS. 4A–4J. Description of the same steps as those in the manufacturing process in the first embodiment will not be repeated.

Figure 4A:
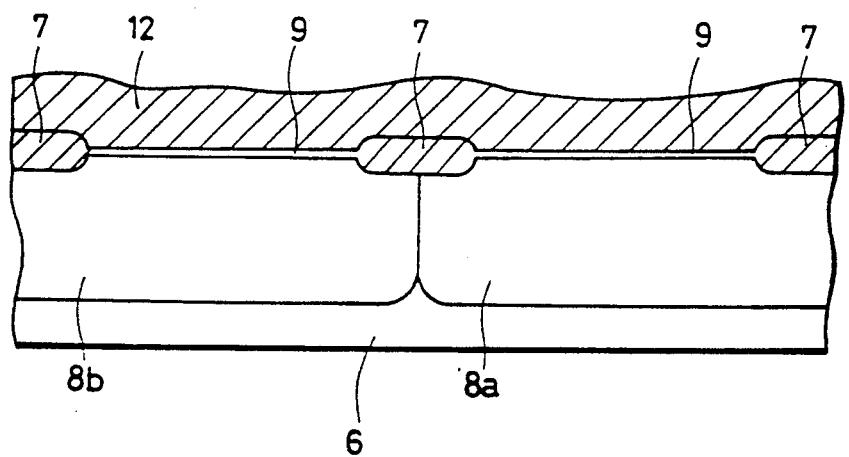
FIGS. 4A, 4B, 4C, 4D, 4E, 4F, 4G, 4H, 4I and 4J are sectional views of the process of manufacturing the CMOS semiconductor device shown in FIG. 3.
Figure 4B:
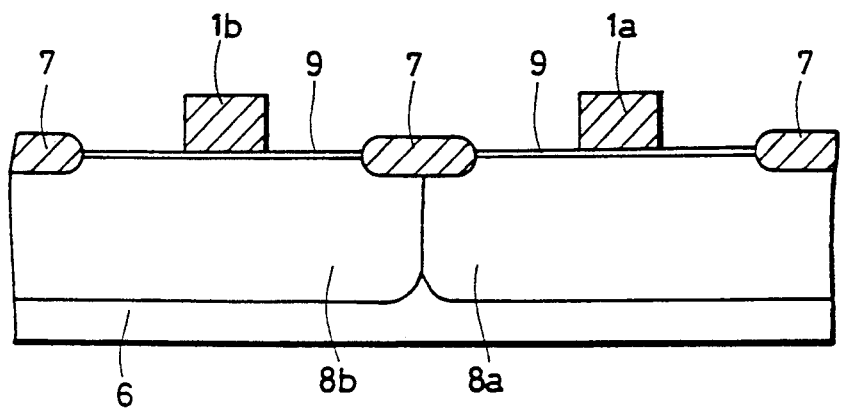
Figure 4C:
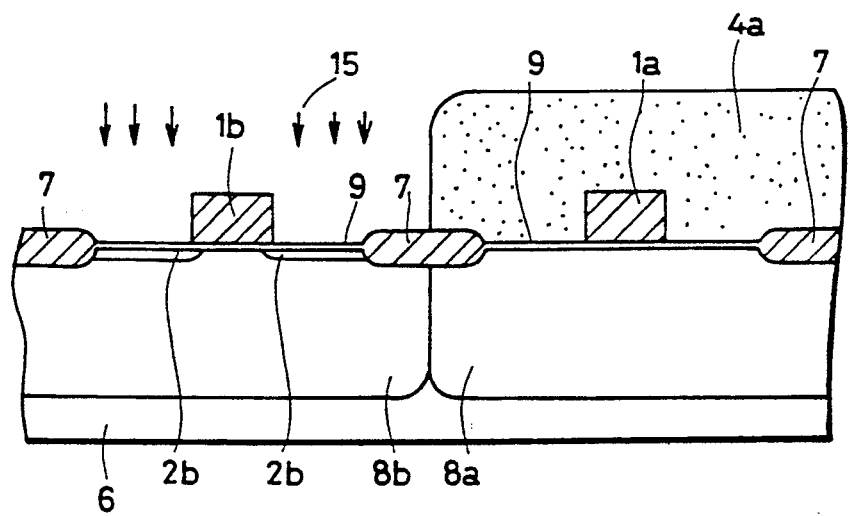
Figure 4D:
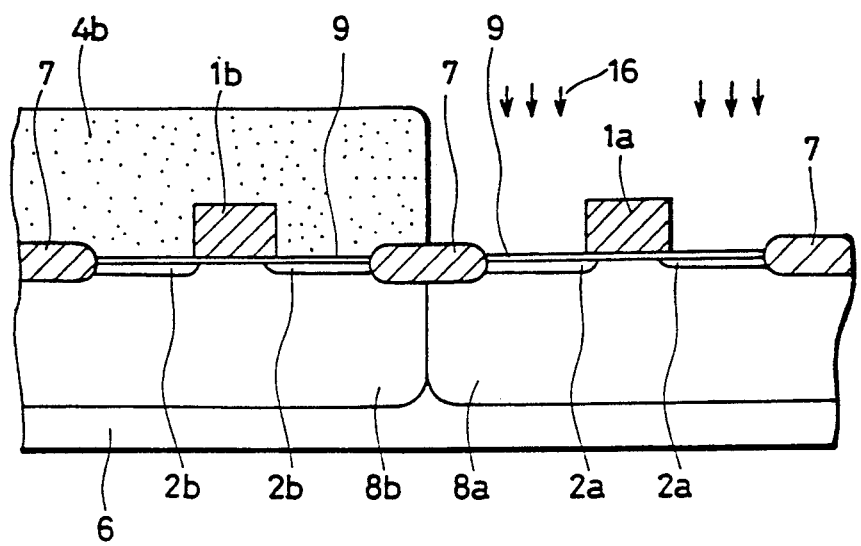
Figure 4E:
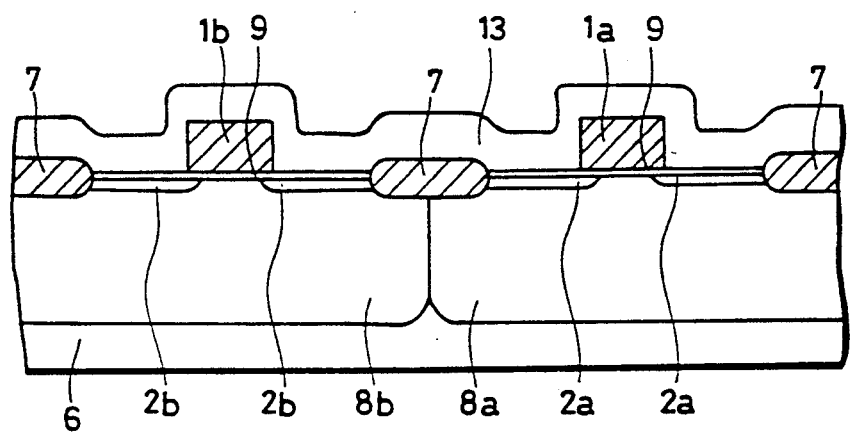

Referring to FIG. 4B, the polysilicon layer 12 formed on the gate insulating film 9 surface is patterned into a rectangular sectional shape using anisotropic etching such as plasma etching. Thus, gate electrodes 1a, 1b having almost vertical sidewalls are formed.

Figure 4F:
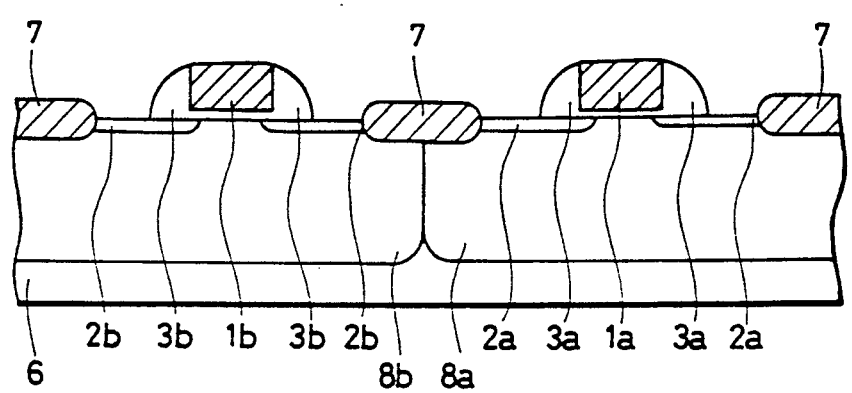

Next, referring to FIG. 4F, the silicon oxide film 13 deposited on the silicon substrate 6 surface is selectively removed using anisotropic etching such as reactive ion etching. Thus, sidewall spacers 3a, 3b with the same film thickness are formed on sidewalls of the gate electrodes 1a, 1b having rectangular sections.

Figure 4G:
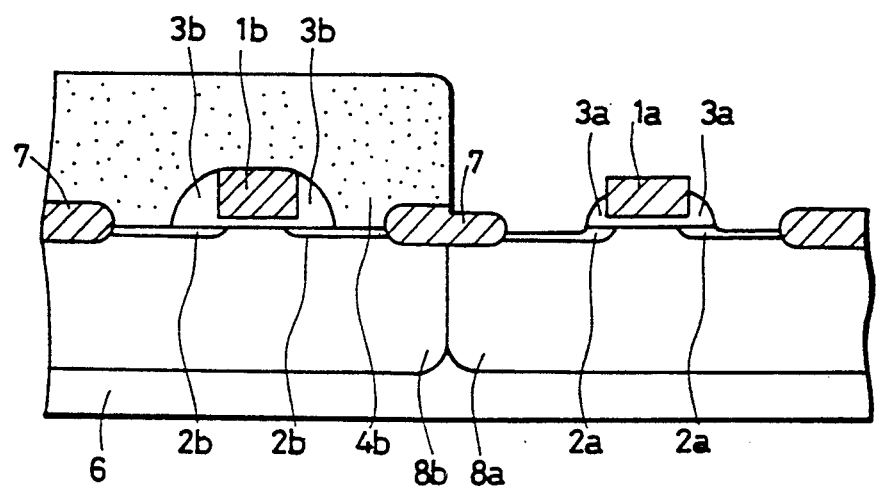
Figure 4H:
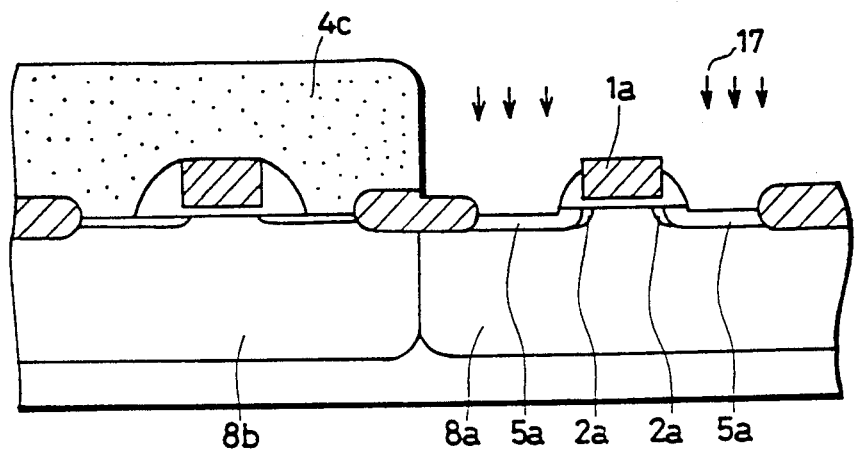
Figure 4I:
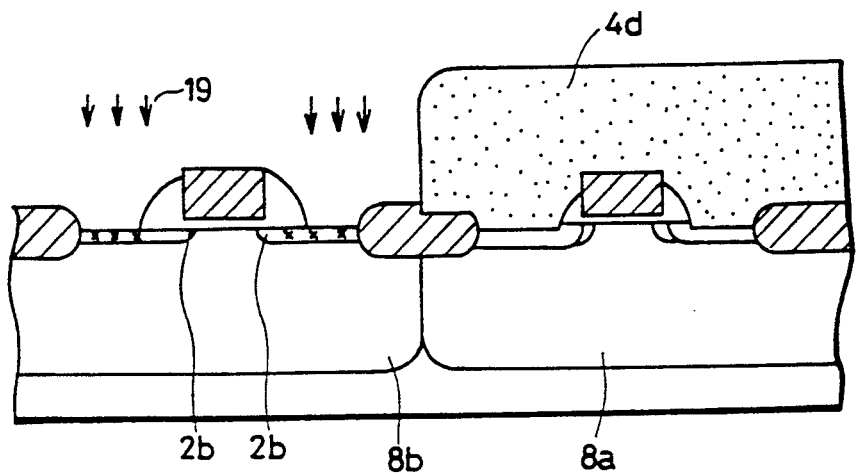
Figure 4J:
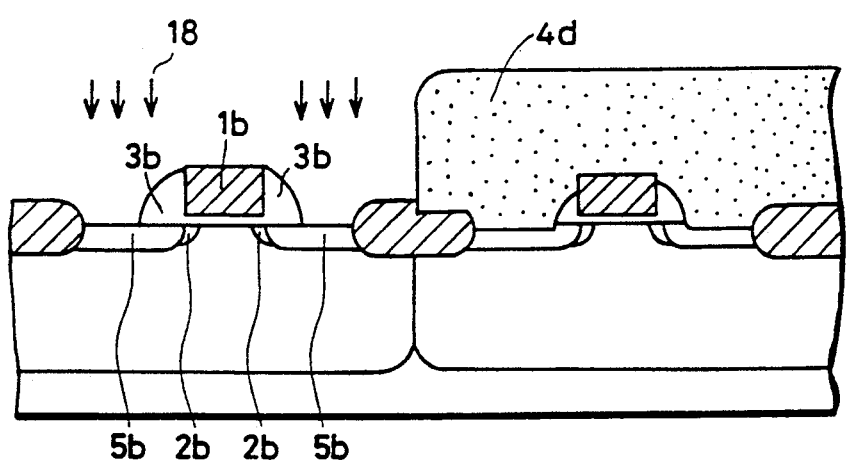

Furthermore, referring to FIG. 4G, the surface of the n well region 8b is covered with a resist pattern 4b. Then, the sidewall spacers 3a formed on the sidewalls of the gate electrode 1a of the n MOS transistor are isotopically etching-removed by setting the etching conditions, employing plasma etching, for example, to reduce the film thickness thereof to a given thickness.

The steps other than those described above are almost the same as those in the first embodiment so that it is not repeated.

As described above, in the second embodiment, by employing the isotropic etching for the second etching of the sidewall spacer 3a shown in FIG. 4G, the film thickness of the sidewall spacer 3a on the gate electrode 1a sidewall, which is formed at a side surface of the gate electrode 1a having an almost vertical sidewall, can be reduced.

Figure 5:
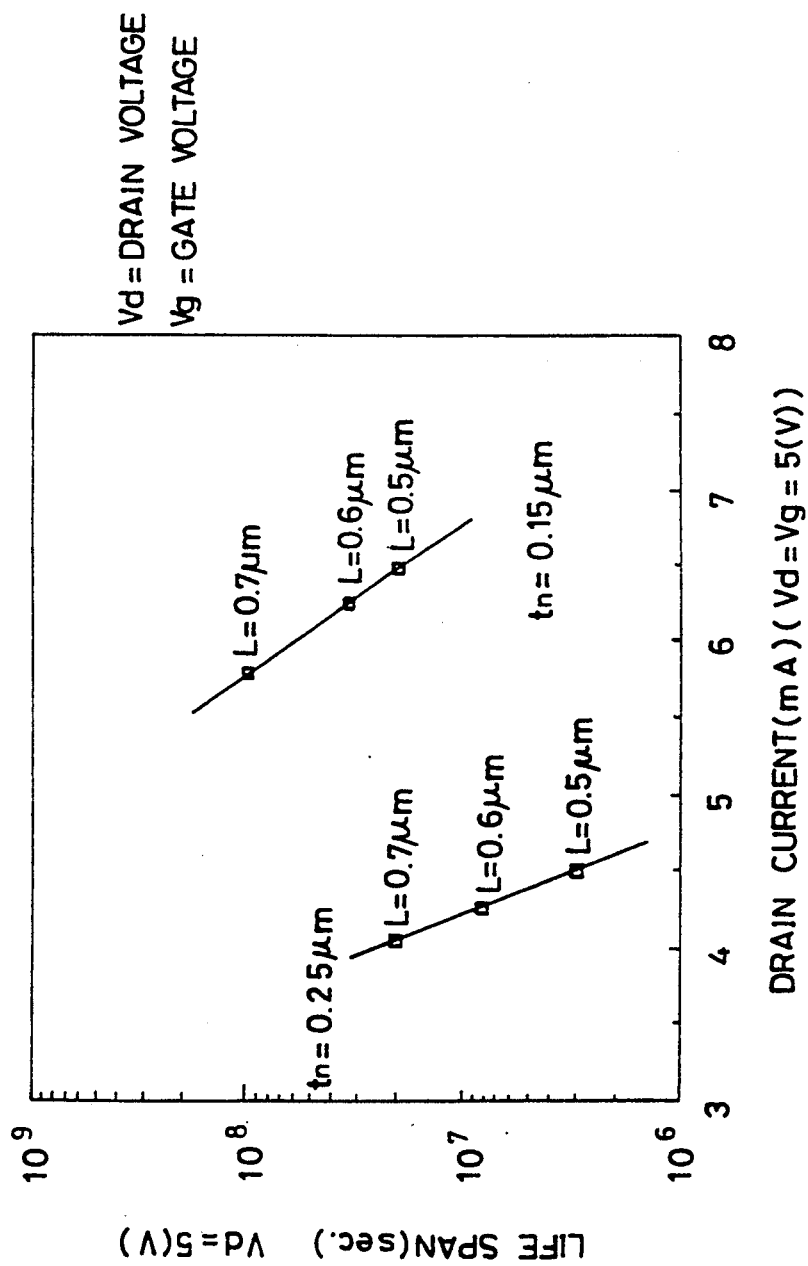
FIG. 5 is a correlation diagram of the drain current and the life span of the n MOS transistor of the CMOS semiconductor device manufactured according to the present invention.
Figure 6:
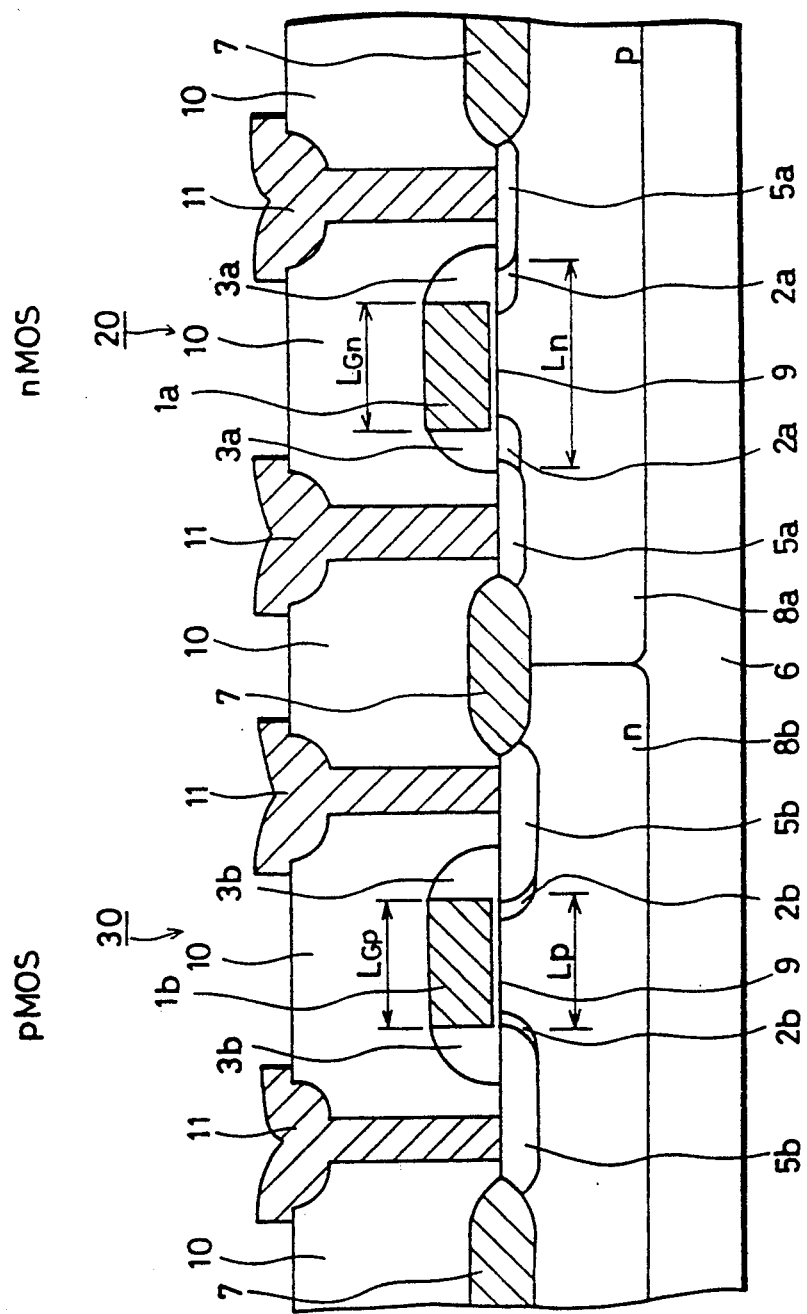
FIG. 6 is a sectional structural view of a conventional CMOS semiconductor device.
Figure 7A:
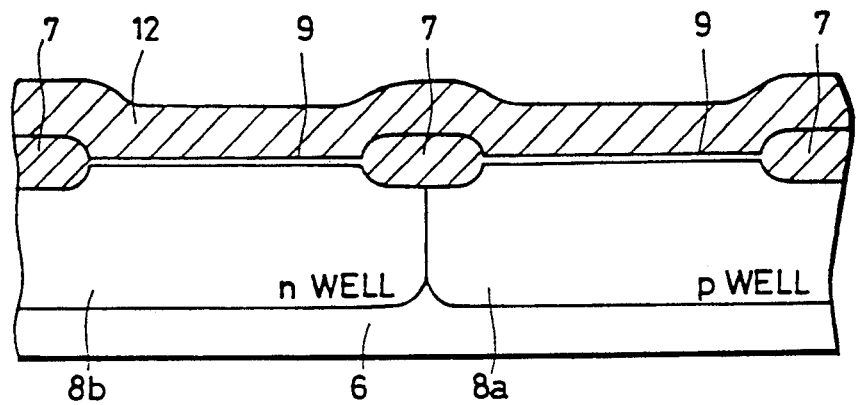
FIGS. 7A, 7B, 7C, 7D, 7E, 7F, 7G and 7H are sectional views of the process of manufacturing the CMOS semiconductor device shown in FIG. 6.
Figure 7B:
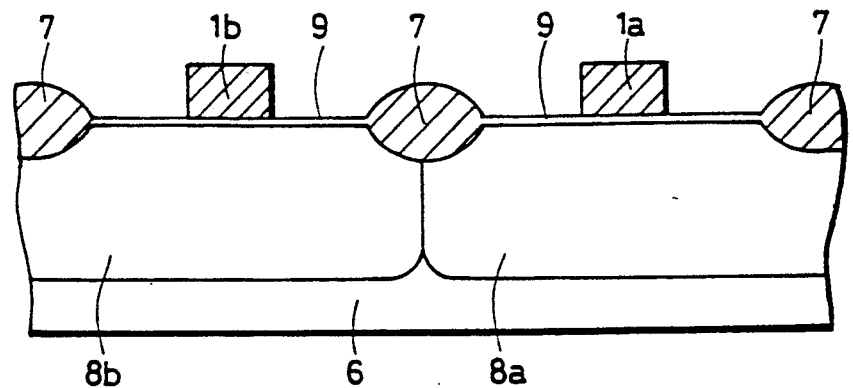
Figure 7C:
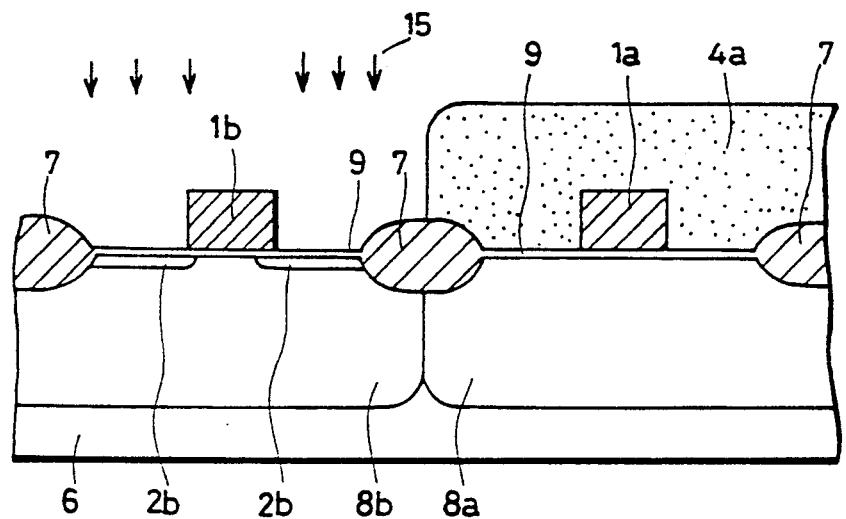
Figure 7D:
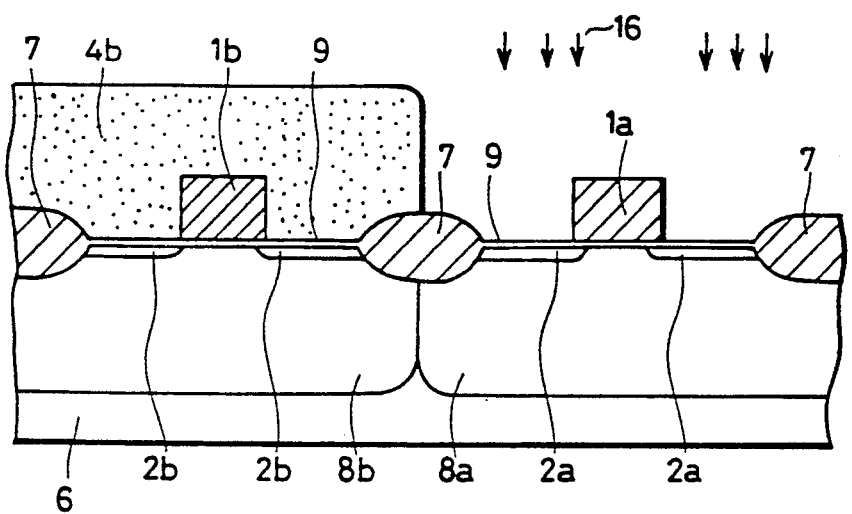
Figure 7E:
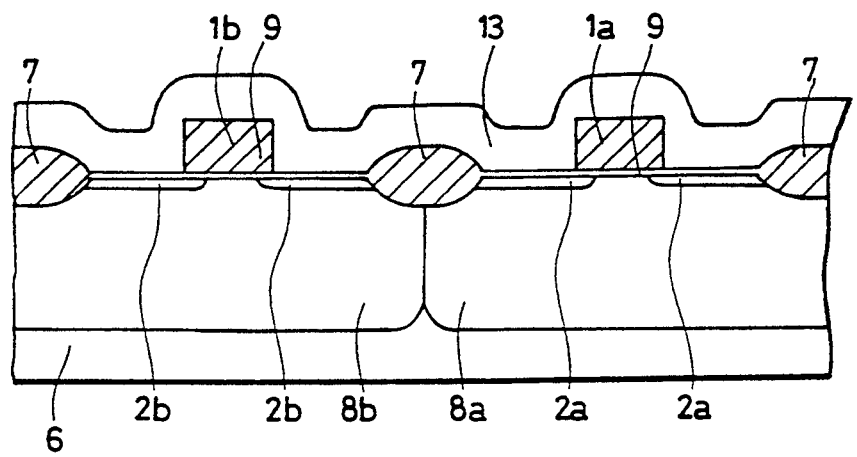
Figure 7F:
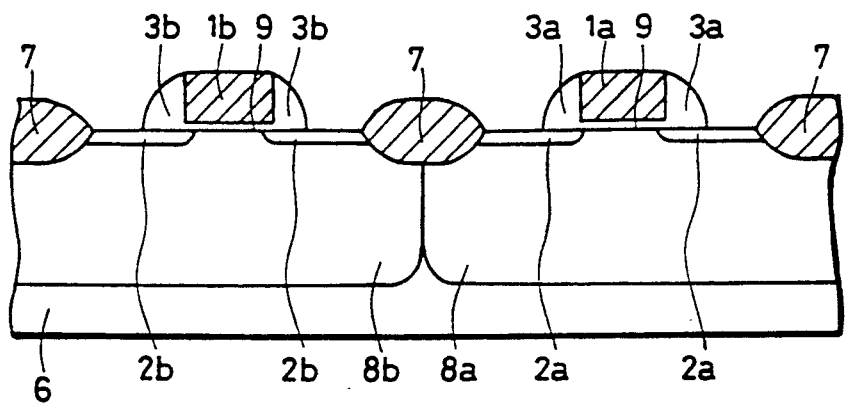
Figure 7G:
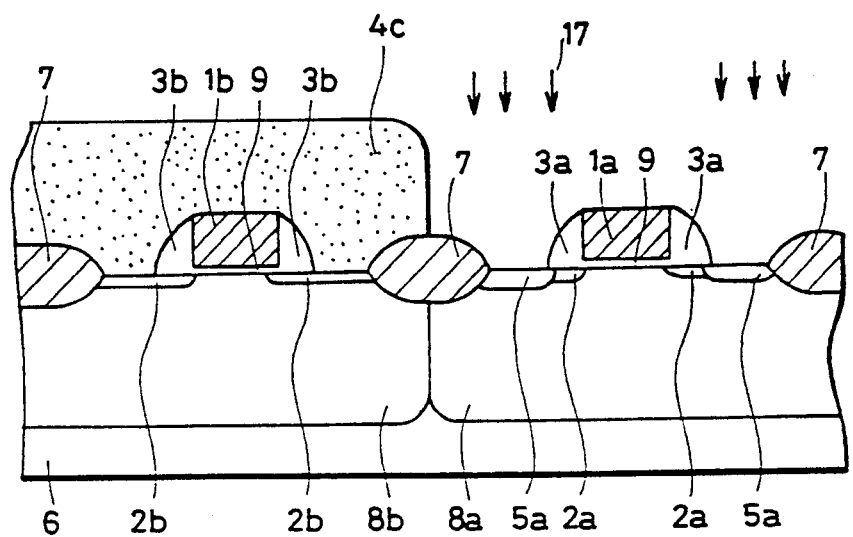
Figure 7H:
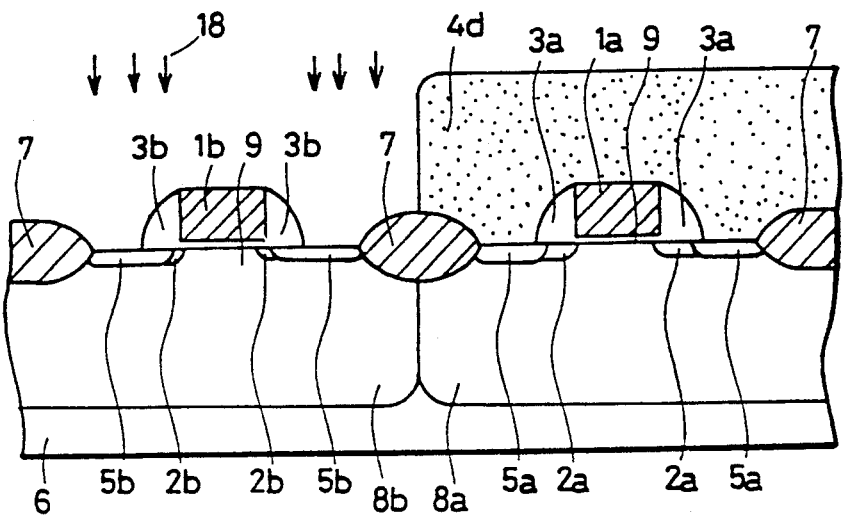

As described above, according to the CMOS semiconductor device of the present invention, thick sidewall spacers 3b are formed in a pMOS transistor, and the diffusion length of impurity regions of the LDD structure is defined using the sidewall spacers 3b. Accordingly, punch through phenomena between the source/drain regions of the pMOS transistor due to excessive thermal diffusion of impurity such as boron can be prevented. In the nMOS transistor, sidewall spacers 3a with a given film thickness different from that of the sidewall spacers 3b of the pMOS transistor are formed, and the diffusion length of the low concentration impurity regions 2a of the LDD structure is defined using these sidewall spacers 3a. Accordingly, the hot electron effect produced as the nMOS transistor structure is miniaturized can be restrained to increase the life span of the transistor, or to enhance the drain breakdown voltage. FIG. 5 is a correlation diagram showing the relation between the film thickness of the sidewall spacer 3a, the drain current and the time span of the nMOS transistor. The value designated by L in the figure indicates gate length. As can be seen from FIG. 5, as compared to a case of the sidewall spacer thickness of 0.25 μm, when it is 0.15 μm, the drain current is larger and the time span is longer.

Although the above description of the embodiments have been made with respect to a CMOS semiconductor device, it is not limited to the same, and similarly applicable to a semiconductor device having structure in which a pMOS transistor and a nMOS transistor are formed on a single semiconductor substrate.

As described above, according to the semiconductor device of the present invention, the LDD structure of a pMOS transistor and a nMOS transistor formed on a single semiconductor substrate is formed employing sidewall spacers having most suitable film thicknesses different from each other, so that a semiconductor device can be implemented which is provided with both of the high punch through resistance necessary for a pMOS transistor and the high resistance to hot electrons and the high drain breakdown voltage necessary for a nMOS transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having a p-channel MOS type field effect transistor and a n-channel MOS type field effect transistor formed on a common semiconductor substrate, comprising the steps of:

forming a p type transistor forming region for forming said n-channel MOS type field effect transistor and an n type transistor forming region for forming said p-channel MOS type field effect transistor in the main surface of the semiconductor substrate;

forming a first insulating layer on a surface of said p type and n type transistor forming region;

forming a polysilicon layer on an upper surface of said first insulating layer;

patterning said polysilicon layer to form a first gate electrode over said n type transistor forming region and a second gate electrode over said p type transistor forming region;

covering said p type transistor forming region and said second gate electrode with a first resist;

implanting a p type impurity into said n type transistor forming region to form first and second low concentration p type impurity regions on opposite sides of said first gate electrode;

removing said first resist;

covering said n type transistor forming region and said first gate electrode with a second resist;

implanting an n type impurity into said p type transistor forming region to form first and second low concentration n type impurity regions on opposite sides of said second gate electrode;

removing said second resist layer;

forming a second insulating layer on the first and second gate electrodes and on said first insulating layer adjacent said first and second gate electrodes;

etching said second insulating layer to form sidewall spaces on opposite sides of each of said first and second gate electrodes;

covering said n type transistor forming region with a third resist;

etching said sidewall spacers formed on the sidewalls of said gate electrode of said p type transistor forming region to reduce a thickness thereof;

implanting an n type impurity into said p type transistor forming region to form high concentration n type impurity regions on said opposite sides of said second gate electrode;

removing said third resist;

covering said p type transistor region with a fourth resist; and implanting a p type impurity into said n type transistor forming region to form high concentration p type impurity regions on said opposite sides of said first gate electrode.

2. A method of manufacturing a semiconductor device having a p-channel MIS type field effect transistor and an n-channel MIS type field effect transistor formed on a single semiconductor substrate, comprising the steps of:

forming a p region for forming said n-channel MIS type field effect transistor and an n region for forming said p-channel MIS type field effect transistor in the main surface of the semiconductor substrate;

forming a first insulating layer on said p and n regions on said main surface of said semiconductor substrate;

forming a polysilicon layer on said first insulating layer;

patterning said polysilicon layer to form a first gate electrode on said p region and a second electrode on said n region;

implanting p type impurities into said n region using said first gate electrode as a mask to form low concentration p type impurity regions;

implanting n type impurities into said p region using said second gate electrode as a mask to form low concentration n type impurity regions;

forming a second insulating layer on said first insulating layer and said first and second gate electrodes;

etching said second insulating layer to form insulating sidewalls on opposing ends of each of said first and second gate electrodes;

etching the insulating sidewalls on said second gate electrode to a predetermined thickness in a gate length direction;

implanting n type impurities into said p region using said second gate electrode and the insulating sidewalls on the second gate electrode as a mask to form high concentration n type impurity regions; and implanting p type impurities into said n region using said first gate electrode and the insulating sidewalls on the first gate electrode as a mask to form high concentration p type impurity regions.

3. The method according to claim 2, wherein the step of patterning to form said first and second gate electrodes includes a step of controlling anisotropic etching to form said first and second gate electrodes having a trapezoidal shape, and the step of etching the insulating sidewalls on said second gate electrode includes anisotropic etching.

4. The method according to claim 2, wherein the step of patterning to form said first and second gate electrodes includes a step of controlling anisotropic etching to form said first and second gate electrodes having a rectangular shape, and the step of etching the insulating sidewalls on said second gate electrode includes isotropic etching.

5. The method according to claim 2, wherein the step of implanting n type impurities to form said low concentration n type impurity regions and the step of implanting p type impurities to form said low concentration p type impurity regions are performed by oblique ion implantation to the main surface of said semiconductor substrate.

* * * * *